(12) United States Patent
Sweat et al.

(10) Patent No.: US 12,482,656 B2
(45) Date of Patent: Nov. 25, 2025

(54) COATING COMPOSITIONS AND METHODS TO ENHANCE SC-1 RESISTANCE

(71) Applicant: Brewer Science, Inc., Rolla, MO (US)

(72) Inventors: Daniel Patrick Sweat, Rolla, MO (US); Jakub Koza, Rolla, MO (US); Jamie Storie, St. James, MO (US)

(73) Assignee: Brewer Science, Inc., Rolla, MO (US)

( * ) Notice: Subject to any disclaimer, the term of this patent is extended or adjusted under 35 U.S.C. 154(b) by 398 days.

(21) Appl. No.: 18/177,546

(22) Filed: Mar. 2, 2023

(65) Prior Publication Data

US 2023/0282478 A1 Sep. 7, 2023

Related U.S. Application Data

(60) Provisional application No. 63/315,794, filed on Mar. 2, 2022.

(51) Int. Cl.
| | | |
|---|---|---|
| *H01L 21/027* | (2006.01) | |
| *C08F 265/04* | (2006.01) | |
| *C09D 163/04* | (2006.01) | |
| *H01L 21/02* | (2006.01) | |
| *H01L 21/308* | (2006.01) | |
| *H01L 21/311* | (2006.01) | |

(52) U.S. Cl.
CPC ........ *H01L 21/0276* (2013.01); *C08F 265/04* (2013.01); *C09D 163/04* (2013.01); *H01L 21/02164* (2013.01); *H01L 21/02186* (2013.01); *H01L 21/3081* (2013.01); *H01L 21/3086* (2013.01); *H01L 21/31144* (2013.01); *H01L 21/31111* (2013.01); *H01L 21/31133* (2013.01)

(58) Field of Classification Search
CPC .. C08F 212/08; C08F 220/302; C09D 125/14; H01L 21/02115; H01L 21/02118; H01L 21/02282; H01L 21/02304; H01L 21/32134; H01L 21/32139; H01L 21/31144; H01L 21/31111; H01L 21/31133

See application file for complete search history.

(56) References Cited

U.S. PATENT DOCUMENTS

| | | |
|---|---|---|
| 9,805,943 B2 | 10/2017 | Kikuchi et al. |
| 10,416,563 B2 | 9/2019 | Satoh et al. |
| 10,514,605 B2 | 12/2019 | Tachibana et al. |
| 10,527,942 B2 | 1/2020 | Sim et al. |
| 11,003,078 B2 | 5/2021 | Ohashi et al. |
| 11,112,696 B2 | 9/2021 | Hashimoto et al. |

(Continued)

OTHER PUBLICATIONS

Huang et al., "Development of planarizing spin-on carbon material for high-temperature processes," 2021 China Semiconductor Tech. Int'l Conf. (CSTIC), IEEE, pp. 1-6, 6 pages.

(Continued)

*Primary Examiner* — Elmito Breval
(74) *Attorney, Agent, or Firm* — HOVEY WILLIAMS LLP

(57) ABSTRACT

Adhesive additives are disclosed that enhance spin-on carbon (SOC) resistance to SC-1 wet etch. The additives can be formed by reacting a polymer or oligomer (such as an adhesion polymer or adhesion oligomer) with 3,4,5-triacetoxybenzoic acid (TABA). When added to standard SOC layers or used as a primer between an SOC layer and substrate, these additives enhance the adhesion of the SOC layer to TiN and other substrates and reduce undercut during SC-1 wet etch.

16 Claims, 5 Drawing Sheets

(56) References Cited

U.S. PATENT DOCUMENTS

| | | |
|---|---|---|
| 11,460,771 B2 | 10/2022 | Endo et al. |
| 2020/0348592 A1 | 11/2020 | Kaitz et al. |
| 2021/0403635 A1 | 12/2021 | Endo et al. |
| 2022/0041810 A1 | 2/2022 | Zhong et al. |
| 2023/0057401 A1 | 2/2023 | Chavez et al. |
| 2023/0099053 A1 | 3/2023 | Lin et al. |
| 2023/0102166 A1 | 3/2023 | Hsieh et al. |
| 2023/0103371 A1 | 4/2023 | Ke et al. |
| 2023/0194990 A1 | 6/2023 | Ke et al. |
| 2023/0260787 A1 | 8/2023 | Keisuke et al. |

OTHER PUBLICATIONS

Chavez et al., "Improving wet etch resistance of organic underlayers," SPIE PC12055, Advances in Patterning Materials and Processes XXXIX (Jun. 13, 2022), published abstract with transcript, 11 pages.

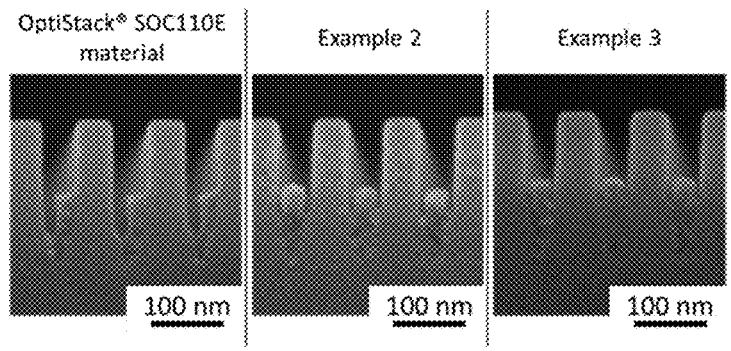
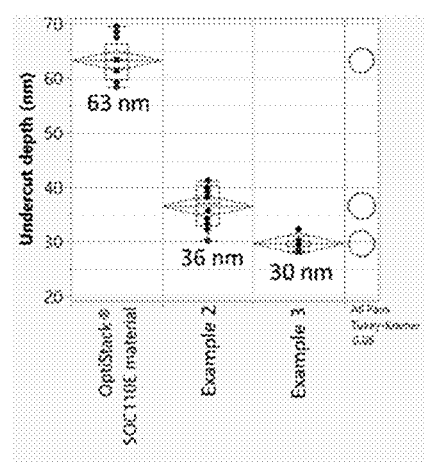
Fig. 5A                Fig. 5B
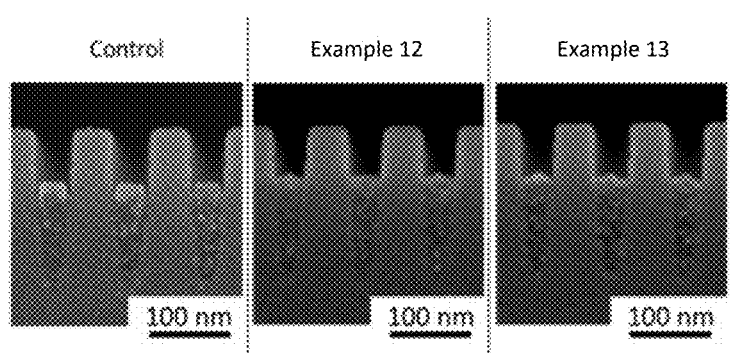
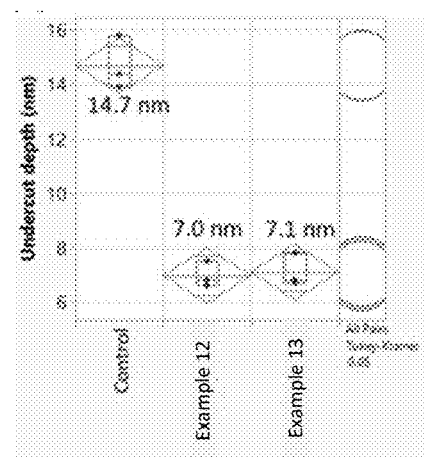
Fig. 6A                Fig. 6B

COATING COMPOSITIONS AND METHODS TO ENHANCE SC-1 RESISTANCE

CROSS-REFERENCE TO RELATED APPLICATIONS

The present application claims the priority benefit of U.S. Provisional Patent Application Ser. No. 63/315,794, filed Mar. 2, 2022, entitled SPIN-ON-CARBON (SOC) COATING COMPOSITIONS WITH ENHANCED SC-1 RESISTANCE, the entirety of which is incorporated by reference herein.

BACKGROUND

Field

The present disclosure relates to materials and methods for fabricating microelectronic structures.

Description of Related Art

As feature sizes become smaller and smaller according to Moore's law, photolithography of semiconductor devices has moved to multilayer patterning. This method involves sequentially patterning multiple layers on top of one another, such as a photoresist layer on top of a hardmask layer on top of a spin-on-carbon ("SOC") layer, in order to increase the etch resistance for smaller features. As each layer is deposited and patterned, depositing a uniform, planarizing layer of material on top of those patterned layers becomes critical for accurate pattern transfer and critical dimension ("CD") control.

The SOC layer is often coated onto substrates either formed from or coated with $SiO_2$, TiN, and other metals. Dry etching is a frequently preferred method to transfer the pattern to the substrate, however, the plasma used in a dry etch process can damage thin oxide and nitride layers. Therefore, wet etching is often used for pattern transfer to the substrates when thin oxide or nitride layers are present. Wet etching of titanium nitride (TiN) is performed at mild temperatures (50-70° C.) in SC-1 cleaning solution, which is an aqueous solution of ammonium hydroxide and hydrogen peroxide. One problem with such wet etching is the undesired etching of TiN in the protected area by undercutting of the SOC layer due to its weak adhesion to TiN. This undesired etching becomes increasingly more problematic as critical dimensions continue to be reduced. As a result, most commercially available SOC products can't be used in applications involving an SC-1 wet etching step.

SUMMARY

In one embodiment, the present disclosure is broadly concerned with a method of forming a microelectronic structure. The method comprises optionally forming one or more intermediate layers on a substrate surface, there being an uppermost intermediate layer on the substrate surface, if one or more intermediate layers are present. A composition is applied to the uppermost intermediate layer, if present, or to the substrate surface, if no intermediate layers are present. The composition comprises a compound comprising a 3,4,5-triacetoxy benzoic acid moiety. The composition is heated to form a carbon-rich layer.

In another embodiment, a method of forming a microelectronic structure comprises optionally forming one or more intermediate layers on a substrate surface, there being an uppermost intermediate layer on the substrate surface, if one or more intermediate layers are present. A primer layer is formed on the uppermost intermediate layer, if present, or on the substrate surface, if no intermediate layers are present. The primer layer is formed from a composition comprising a compound comprising a 3,4,5-triacetoxy benzoic acid moiety. A carbon-rich layer is formed on the primer layer.

In a further embodiment of the disclosure, a microelectronic structure is provided. The microelectronic structure comprises a substrate having a substrate surface. There is optionally one or more intermediate layers on the substrate surface, there being an uppermost intermediate layer on the substrate surface, if one or more intermediate layers are present. A carbon-rich layer is on the uppermost intermediate layer, if present, or on the substrate surface, if no intermediate layers are present. The carbon-rich layer is formed from a composition comprising a compound comprising a 3,4,5-triacetoxy benzoic acid moiety.

The disclosure also provides a microelectronic structure comprising a substrate having a substrate surface, with optionally one or more intermediate layers on the substrate surface. There is an uppermost intermediate layer on the substrate surface, if one or more intermediate layers are present. A primer layer is on the uppermost intermediate layer, if present, or on the substrate surface, if no intermediate layers are present. The primer layer is formed from a composition comprising a compound comprising a 3,4,5-triacetoxy benzoic acid moiety. There is a carbon-rich layer on the primer layer.

The disclosure also provides a polymer comprising monomers at least some of which have 3,4,5-triacetoxy benzoic acid bonded thereto.

In yet a further embodiment, the disclosure also provides a composition comprising a polymer that comprises monomers at least some of which have 3,4,5-triacetoxy benzoic acid bonded thereto.

BRIEF DESCRIPTION OF THE DRAWINGS

FIG. 5A shows scanning electron microscope (SEM) images of cross-sections of TiN chips comparing the undercut of the Examples 2 and 3 formulations compared to a control during SC-1 resistance testing (see Example 4):

FIG. 5B is a graph comparing the respective undercut depths of the samples shown in FIG. 5A;

FIG. 6A shows SEM images of cross-sections of TiN chips comparing the undercut of the Examples 12 and 13 formulations to a control during SC-1 resistance testing (see Example 14):

FIG. 6B is a graph comparing the respective undercut depths of the samples shown in FIG. 6A:

DETAILED DESCRIPTION

Figure 1:
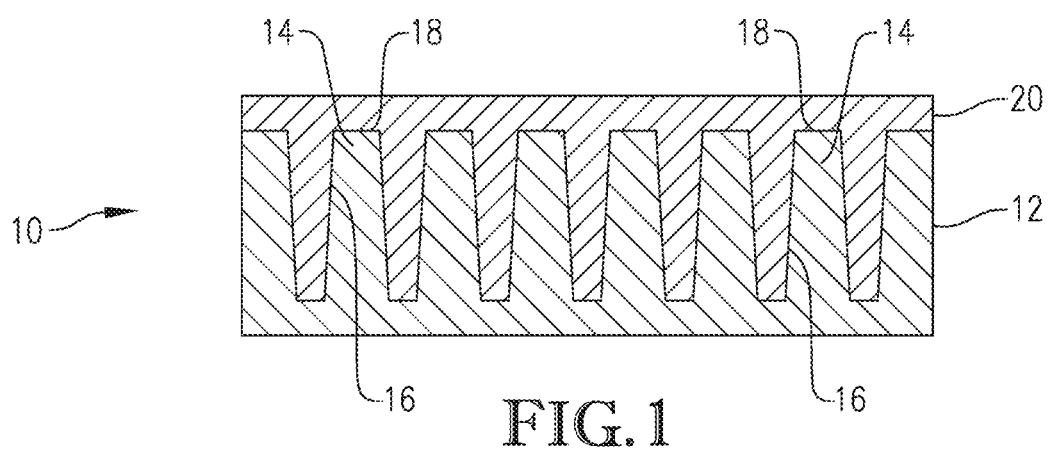
FIG. 1 is a schematic, sectional view (not to scale) of an embodiment of the invention that includes an SOC layer without a primer layer, with the SOC layer having a compound functionalized with 3,4,5-triacetoxy benzoic acid.

The present disclosure is broadly concerned with additives that are suitable for improving SC-1 resistance in spin-on carbon (SOC) layers (also referred to herein as carbon-rich layers). This can be accomplished by incorporation of the additive into the SOC layer, into a primer layer under the SOC layer, or both. The SC-1 resistant SOC layer (whether its resistance is from inclusion of the additives in the SOC layer itself, inclusion of the additives in a primer layer, or both) can be coated onto substrates formed from or coated with $SiO_2$, TiN, and other metals to facilitate use of the SOC layer in processes involving an SC-1 wet etching step.

Additives

Suitable additives preferably comprise a compound having a 3,4,5-triacetoxy benzoic acid moiety(ies). The compound can be a polymer or an oligomer having the 3,4,5-triacetoxy benzoic acid moiety(ies). The additives can be synthesized by reacting, preferably via a grafting reaction, the polymer and/or oligomer with 3,4,5-triacetoxy benzoic acid in a solvent in the presence of a catalyst.

Suitable polymers or oligomers include adhesion polymers and/or adhesion oligomers. Examples include polymers and/or oligomers of one or more monomers chosen from phenolic compounds (e.g., novolacs), styrene, styrene-containing compounds, glycidyl-containing compounds (e.g., glycidyl methacrylate), 2-hydroxyethyl methacrylate (HEMA), hydroxypropyl methacrylate (HPMA), hydroxy butylacrylate, or combinations thereof. In some embodiments, the polymer and/or oligomer is chosen from epoxy novolacs, such as epoxy cresol novolacs, epoxy phenol novolacs, or combinations thereof.

Suitable catalysts include those chosen from quaternary ammonium salts such as benzyltriethylammonium chloride (BTEAC), tetrabutylammonium bromide, tetrabutylammonium iodide, quaternary phosphonium salts (e.g., ethyltriphenylphosphonium bromide, tetrabutylphosphonium bromide), or combinations thereof.

Suitable solvents in which the reaction can be carried out include those chosen from propylene glycol monomethyl ether acetate (PGMEA), propylene glycol monomethyl ether (PGME), propylene glycol ethyl ether (PGEE), toluene, xylene, acetonitrile, tetrahydrofuran, dioxane, cyclohexanone, cyclopentanone, gamma-butyrolactone, N,N-dimethylformamide, N,N-dimethylacetamide, N-methylpyrrolidone, n-propanol, ethanol, or mixtures thereof.

The compound (i.e., polymer and/or oligomer) and 3,4, 5-triacetoxy benzoic acid are preferably dissolved or dispersed in the solvent(s) at a molar ratio of compound to 3,4,5-triacetoxy benzoic acid of about 0.75:1 to about 1.25: 1, preferably about 0.9:1 to about 1.1:1, and more preferably about 1:1. In one embodiment, the total quantity of the compound and 3,4,5-triacetoxy benzoic acid in the polymerization mixture is about 5% by weight to about 50% by weight, more preferably about 10% by weight to about 30% by weight, and even more preferably about 20% by weight to about 25% by weight, based upon the total weight of the reaction system taken as 100% by weight.

The total amount of catalyst in the polymerization mixture is preferably about 0.1% by weight to about 1.0% by weight, more preferably about 0.25% by weight to about 0.7% by weight, and even more preferably about 0.5% by weight, based upon the total weight of the reaction system taken as 100% by weight.

Preferably the grafting reaction is carried out while stirring, preferably under nitrogen. The temperatures at which the grafting reaction is carried out may be varied depending upon the selected catalyst. For example, BTEAC with its chloride counterion would typically require a higher temperature than a bromide salt or an iodide salt. Regardless, typical temperatures are about 50° C. to about 140° C., and preferably about 100° C. to about 120° C., for about 8 hours to about 24 hours, and preferably about 12 hours to about 20 hours.

In some embodiments, the resulting additive is precipitated from the reaction solution. In other embodiments, precipitation of the additive from the reaction solution is not carried out. That is, the reaction solution, which includes the functionalized polymer, can be used as-obtained.

SOC (Carbon-Rich) Compositions with Additive

In one embodiment, the above-described additive can be incorporated into an SOC composition. This can be accomplished by "custom" formulating an SOC composition that includes the additive along with the other desired SOC components, or by mixing the additive in a commercially available SOC composition.

Regardless of the embodiment, the SOC compositions preferably comprise the above-described additive and a carbon-rich polymer different from the additive dispersed or dissolved in a solvent system. The SOC composition may also comprise optional ingredients such as those chosen from crosslinkers, surfactants, polymers (in addition to the carbon-rich polymer), catalysts, additives, or mixtures thereof.

Suitable carbon-rich polymers include those chosen from polystyrene, functionalized polystyrene derivatives (e.g., poly(4-methylstyrene), poly(vinyl naphthalene)), polysulfones, polyethersulfones, poly(ether ether ketone), polycarbonates, epoxies, novolacs, polyimides, or combinations thereof. The carbon-rich polymer will preferably be present in the SOC composition at levels of about 1% by weight to about 30% by weight solids, more preferably about 3% by weight to about 10% by weight, and even more preferably about 4% by weight to about 7% by weight, based upon the total weight of the composition taken as 100% by weight.

The additive will preferably be present in the SOC composition at levels of about 1% by weight to about 60% by weight, more preferably about 2% by weight to about 40% by weight, and even more preferably about 5% by weight to about 15% by weight, based upon the total weight of the carbon-rich polymer taken as 100% by weight.

In some embodiments, a catalyst may be included in the SOC composition. Suitable catalysts include those chosen from quaternary ammonium blocked triflic acid thermal acid generators (e.g., TAG2689, TAG2690, both from King Industries), benzyltriethylammonium chloride, ethyltriphenylphosphonium bromide, tetrabutylphosphonium bromide, or mixtures thereof. The catalyst is preferably present at levels of about 0.1% by weight to about 10% by weight, more preferably about 0.5% by weight to about 5% by weight, and even more preferably about 1% by weight, based upon the total weight of the carbon-rich polymer taken as 100% by weight.

In some embodiments, a surfactant may be included in the SOC composition to improve coating quality. Nonionic surfactants such as R30N (DIC Corporation, Japan) and FS3100 (The Chemours Company FC, LLC. USA) are suitable surfactants for use herein. In embodiments that include a surfactant, the surfactant is preferably present at levels of about 0.05% by weight to about 0.5% by weight, and more preferably about 0.1% by weight to about 0.3% by weight, based upon the total weight of the carbon-rich polymer taken as 100% by weight.

The above ingredients are mixed in a solvent system to form the particular composition. Preferred solvent systems include one or more solvents chosen from PGMEA, PGME, PGEE, cyclopentanone, cyclohexanone, anisole, acetophenone, or mixtures thereof. The solvent system is preferably utilized at a level of about 80% by weight to about 99% by weight, more preferably about 85% by weight to about 97% by weight, and even more preferably about 92% by weight to about 95% by weight, based upon the total weight of the SOC composition taken as 100% by weight. The material is preferably filtered before use, such as with a 0.1-µm or 0.2-µm PTFE filter.

In one embodiment, the SOC compositions consist essentially of, or even consist of, the carbon-rich polymer and the additive dispersed or dissolved in a solvent system. In another embodiment, the SOC compositions consist essentially of, or even consist of, the carbon-rich polymer and the additive dispersed or dissolved in a solvent system, along with one, two, three, four, or all five of a crosslinker(s), surfactant(s), additional polymer(s), catalyst(s), and/or other additive(s).

Primer Compositions with Additive

In some embodiments, the primer compositions described herein comprise the previously described additive dispersed or dissolved in a solvent system. In other embodiments, the primer composition may include optional ingredients, such as those chosen from crosslinkers, surfactants, polymers (other than the additive polymer), catalysts, additives, or mixtures thereof.

The primer compositions are formed by mixing the additive and any other ingredients in a solvent system. The additive will preferably be present in the primer composition at levels of about 0.1% by weight to about 20% by weight, more preferably about 0.2% by weight to about 10% by weight, and even more preferably about 0.4% by weight to about 5% by weight, based upon the total weight of the primer composition taken as 100% by weight.

Preferred solvent systems include a solvent chosen from PGMEA, PGME, PGEE, cyclopentanone, cyclohexanone, or mixtures thereof. The solvent system is preferably utilized at a level of about 80% by weight to about 99.9% by weight, more preferably about 90% by weight to about 99.8% by weight, and even more preferably about 95% by weight to about 99.6% by weight, based upon the total weight of the primer composition taken as 100% by weight. The material is preferably filtered before use, such as with a 0.1-µm or 0.2-µm PTFE filter.

In one embodiment, the primer composition consists essentially of, or even consists of, the additive dispersed or dissolved in a solvent system. In another embodiment, the primer composition consists essentially of, or even consists of, the additive dispersed or dissolved in a solvent system, along with one, two, or all three of a surfactant(s), catalyst(s), and/or other additive(s).

Methods of Using the Compositions

A method of forming a microelectronic structure that is particularly suited for lithography is provided. Any microelectronic substrate can be utilized, but the substrate is preferably a semiconductor substrate, such as substrates chosen from silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, tetramethyl silate and tetramethylcyclotetrasiloxane combinations (such as that sold under the name CORAL), SiCOH (such as that sold under the name Black Diamond, by SVM, Santa Clara, CA, US), glass, or combinations of the foregoing. Optional intermediate layers may be formed on the substrate prior to processing, with preferred intermediate layers being TiN or $SiO_2$ layers. The substrate can have a planar surface, or it can include topographic features (via holes, trenches, contact holes, raised features, lines, etc.). As used herein, "topography" refers to the height or depth of a structure in or on a substrate surface.

When a primer layer is utilized, it can be formed on the substrate or any intermediate layers from conventional primer compositions (e.g., hexamethyldisilizane) or from the previously described primer composition (i.e., one that includes the 3,4,5-triacetoxybenzoic acid-functionalized oligomer and/or polymer). Conventional primer compositions can be applied by, for example, exposing the wafer to vapor of the primer composition in a sealed chamber while heating (e.g., at about 150° C. for about 90 seconds). Additive-containing primer layers can be formed by any known application method, with one preferred method being spin-coating at speeds of about 1.000 rpm to about 2.500 rpm, and preferably about 1.200 rpm to about 2.000 rpm, for a time period of about 20 seconds to about 90 seconds, and preferably about 30 seconds to 60 seconds. The applied additive-containing primer composition can be optionally heated to a temperature of about 80° C. to about 200° C. and more preferably about 100° C. to about 150° C. for about 30 seconds to about 90 seconds, and preferably about 45 seconds to about 75 seconds, to evaporate solvents. Preferably, the primer composition has good spin bowl compatibility, that is, it will not react or form a precipitate with common photoresist solvents such as PGME, PGMEA, ethyl lactate, cyclohexanone, or combinations thereof.

Any excess primer layer is preferably stripped using solvent by puddling solvent on the surface of the primer layer for a time period of about 10 seconds to about 60 seconds, preferably about 30 seconds, and then spin-drying at speeds of about 1.000 rpm to about 2.500 rpm, and preferably about 1.500 rpm to about 2.000 rpm, for a time period of about 20 seconds to about 90 seconds, and preferably about 30 seconds to 60 seconds. Suitable stripping solvents include PGME, PGMEA, ethyl lactate, cyclohexanone, or mixtures thereof.

The average thickness of the primer layer after baking is typically about 0.1 nm to about 1 µm, preferably about 0.2 nm to about 100 nm, and more preferably about 0.5 nm to about 10 nm. In one embodiment, the thickness of the formed primer layer is just one monolayer. As used herein, the average thickness is determined by taking the average of thickness measurements at five different locations of the primer layer, with those thickness measurements being obtained using ellipsometry.

A layer of SOC composition is formed on the substrate or any intermediate layers (e.g., a primer layer). The SOC composition can be a conventional SOC layer, in embodiments where an additive-containing primer layer was utilized. In some preferred embodiments, the SOC composition comprises the previously described 3,4,5-triacetoxy benzoic acid-functionalized polymer and/or oligomer, regardless of the presence or type of primer layer.

Regardless of the SOC composition utilized, the SOC layer can be formed by any known application method, with one preferred method being spin-coating at speeds of about 500 rpm to about 3.000 rpm, and preferably about 1.200 rpm to about 2.000 rpm, for a time period of about 10 seconds to about 90 seconds, and preferably about 30 seconds to 60 seconds. Preferably, the SOC composition has good spin bowl compatibility, that is, it will not react or form a precipitate with common photoresist solvents such as PGME. PGMEA, ethyl lactate, cyclohexanone, or mixtures thereof.

After the SOC composition is applied, it is preferably heated to a temperature of about 150° C. to about 250° C. and more preferably about 200° C. to about 220° C. for about 10 seconds to about 120 seconds, and preferably about 30 seconds to about 60 seconds, to evaporate solvents.

The average thickness of the SOC layer after baking is preferably about 50 nm to about 3 μm, more preferably about 100 nm to about 300 nm, and even more preferably about 150 nm to about 200 nm. The average thickness is determined by taking the average of thickness measurements at five different locations of the SOC layer, with those thickness measurements being obtained using ellipsometry.

After baking, the SOC layers formed preferably comprise greater than about 75% by weight carbon, more preferably greater than about 80% by weight carbon, and even more preferably about 85% to about 90% by weight carbon, based upon final layer of composition taken as 100% by weight (i.e., the SOC layer is "carbon-rich").

The SOC layer preferably has little or no shrinkage. That is, the average thickness decreases by less than about 5% after being heated to about 400° C. for about 10 minutes and, even more preferably, the thickness decreases less than about 5% after being heated to about 500° C. for about ten minutes. In some cases, the shrinkage of the SOC layer may be negative, meaning the thickness of the layer increases after the described baking conditions, indicating swelling of the SOC layer. (In these cases, it is theorized that the SOC layer may become less dense after high-temperature bakes, leading to a small weight loss, but slight film swelling.) In one embodiment, the SOC layer has good SC-1 resistance, in that it is not affected by exposure in an SC-1 cleaning solution for more than about 30) minutes at about 60° C.

A hardmask layer may be applied to the SOC layer or to any intermediate layers that might be present on the SOC layer. The hardmask layer can be formed by any known application method, such as chemical vapor deposition ("CVD") or plasma-enhanced chemical vapor deposition ("PECVD"). Another preferred method comprises spin-coating at speeds of about 1.000 rpm to about 5.000 rpm, and preferably about 1.250 rpm to about 1.750 rpm, for a time period of about 30 seconds to about 120 seconds, and preferably about 45 seconds to about 75 seconds. Suitable hardmask layers should have a high etch bias relative to underlying layers. Preferred hardmask layers have high-silicon-content materials, preferably at least about 30% by weigh silicon, and more preferably from about 35% by weight to about 40% by weight silicon, based on the total weight of the hardmask layer. Suitable hardmask layers are commercially available and can be formed from a composition comprising a polymer or oligomer (e.g., silanes, siloxanes, silsesquioxanes, silicon oxynitride, silicon nitride, polysilicon, amorphous silicon, and combinations thereof) dissolved or dispersed in a solvent system. Some preferred monomers or polymers for use in the hardmask layer are selected from the group containing phenethyltrimethoxysilane ("PETMS"), 2-(carbomethoxy)ethyltrimethoxysilane ("CMETMS"), tetraethoxysilane ("TEOS"), methyltrimethoxysilane, phenyltrimethoxysilane, methyltrimethoxysilane ("MTMS"), ethyltrimethoxysilane ("ETMS"), (3-glycidyoxypropyl)triethoxysilane, 2-(3,4-epoxycyclohexyl)ethyltrimethyoxysilane ("ECHTMS"), and mixtures thereof. Any optional ingredients (e.g., surfactants, acid catalysts, base catalysts, and/or crosslinkers) are dissolved in the solvent system along with the polymer, monomer, and/or oligomer. Preferred hardmask compositions will preferably have a solids content of about 0.1% to about 70%, more preferably about 0.5% to about 10%, and even more preferably about 0.5% to about 1% by weight, based upon the total weight of the composition taken as 100% by weight.

After the hardmask composition is applied, it is preferably heated to a temperature of about 100° C. to about 300° C. and more preferably about 150° C. to about 250° C. and for a time period of about 30 seconds to about 120 seconds, and preferably about 45 seconds to about 60 seconds, to evaporate solvents. The average thickness (measured by ellipsometry over five locations and averaged) of the hardmask layer after baking is preferably about 5 nm to about 50.000 nm, more preferably about 5 nm to about 1000 nm, and even more preferably about 10 nm to about 30 nm.

Next, a photoresist (i.e., imaging layer) can be applied to the SOC layer, or to any intermediate layer on the SOC layer, to form a photoresist layer. The photoresist layer can be formed by any conventional method, with one preferred method being spin coating the photoresist composition at speeds of about 350 rpm to about 4.000 rpm (preferably about 1.000 rpm to about 2.500 rpm) for a time period of about 10 seconds to about 60 seconds (preferably about 10 seconds to about 30 seconds). The photoresist layer is then optionally post-application baked ("PAB") at a temperature of at least about 70° C. preferably about 80° C. to about 150° C. and more preferably about 100° C. to about 150° C. for time periods of about 30 seconds to about 120 seconds. The average thickness (determined as described previously) of the photoresist layer after baking will typically be about 5 nm to about 120 nm, preferably about 10 nm to about 50 nm, and more preferably about 20 nm to about 40 nm.

The photoresist layer is subsequently patterned by exposure to radiation for a dose of about 10 $mJ/cm^2$ to about 200 $mJ/cm^2$, preferably about 15 $mJ/cm^2$ to about 100 $mJ/cm^2$, and more preferably about 20 $mJ/cm^2$ to about 50 $mJ/cm^2$. More specifically, the photoresist layer is exposed using a mask positioned above the surface of the photoresist layer. The mask has areas designed to permit the radiation to reflect from or pass through the mask and contact the surface of the photoresist layer. The remaining portions of the mask are designed to absorb the light to prevent the radiation from contacting the surface of the photoresist layer in certain areas. Those skilled in the art will readily understand that the arrangement of reflecting and absorbing portions is designed based upon the desired pattern to be formed in the photoresist layer and ultimately in the substrate or any intermediate layers.

After exposure, the photoresist layer is preferably subjected to a post-exposure bake ("PEB") at a temperature of less than about 180° C. preferably about 60° C. to about 140°

C. and more preferably about 80° C. to about 130° C. for a time period of about 30 seconds to about 120 seconds (preferably about 30 seconds to about 90 seconds).

The photoresist layer is then contacted with a developer to form the pattern. Depending upon whether the photoresist used is positive-working or negative-working, the developer will either remove the exposed portions of the photoresist layer or remove the unexposed portions of the photoresist layer to form the pattern. The pattern is then transferred through the various layers, and finally to the substrate. This pattern transfer can take place via plasma etching (e.g., $CF_4$ etchant, $O_2$ etchant) or a wet etching or developing process.

In one embodiment, once the layer has been patterned, an SC-1 etch can be used to open the metal layer (e.g., TiN) used as another hardmask to transfer the pattern further into the substrate. The inventive SOC layer, or a conventional SOC layer with the inventive primer layer, will experience little to no undercut, meaning it will protect the metal layer from dissolution where the SOC layer is present.

FIG. 1 depicts one embodiment according to the process described above. In this embodiment, a stack 10 is provided. Stack 10 includes an intermediate layer 12, which has been formed on a substrate (not shown), or on another intermediate layer (not shown) that is on a substrate. In this embodiment, intermediate layer 12 is a metal-containing layer, such as TiN or $SiO_2$. Intermediate layer 12 has topographical features 14 that have respective sidewalls 16 and upper surfaces 18. Stack 10 further includes an SOC layer 20 formed so that it contacts and preferably coats, in a planarizing manner, substantially all of sidewalls 16 and upper surfaces 18 of the topographical features 14. In this embodiment, the SOC layer 20 includes a compound functionalized with 3,4,5-triacetoxybenzoic acid, as described previously.

Figure 2:
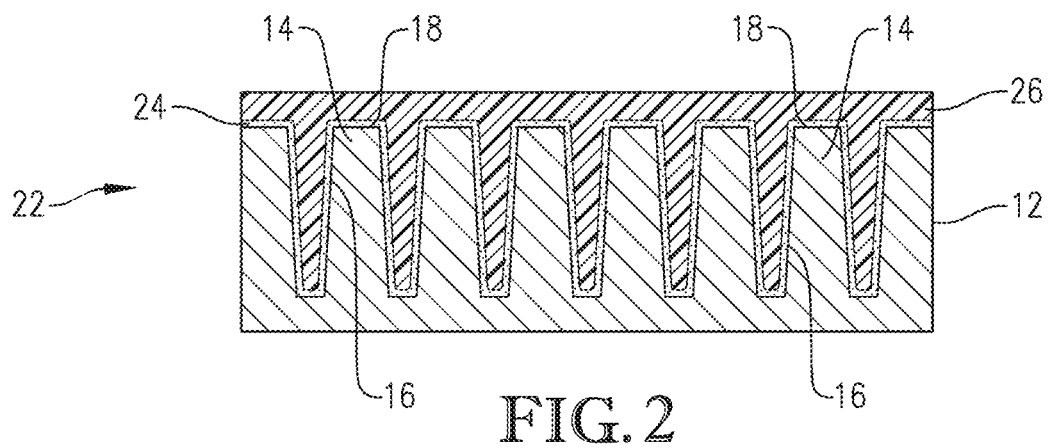
FIG. 2 is a schematic sectional view (not to scale) of an embodiment of the invention that includes both a primer layer and an SOC layer, with either one or both of those layers including a compound functionalized with 3,4,5-triacetoxy benzoic acid.

FIG. 2 depicts an alternative embodiment, with like numbering representing like parts. In this embodiment, a stack 22 includes a primer layer 24 that contacts and preferably conformally coats substantially all of respective sidewalls 16 and upper surfaces 18 of the topographical features 14. An SOC layer 26 is then formed on the primer layer 24, with that SOC layer 26 preferably being substantially planarizing. In this embodiment, a compound functionalized with 3,4,5-triacetoxybenzoic acid can be included in primer layer 24, SOC layer 26, or both primer layer 24 and SOC layer 26 (all as described individually in more detail previously).

Figure 3:
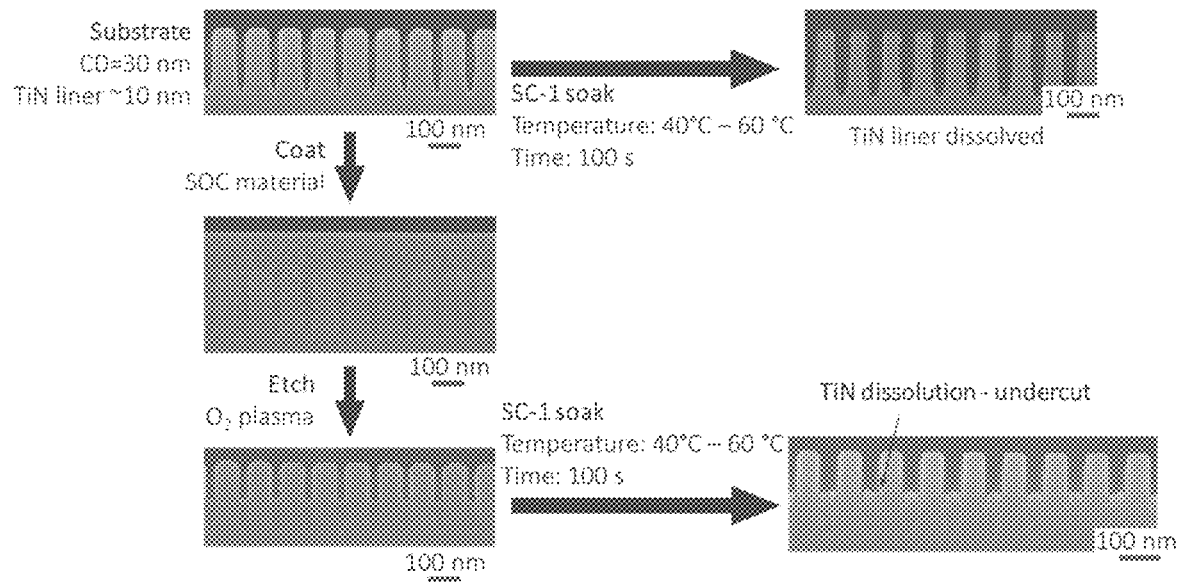
FIG. 3 shows the test flow of an exemplary SC-1 resistance testing procedure.
Figure 4:
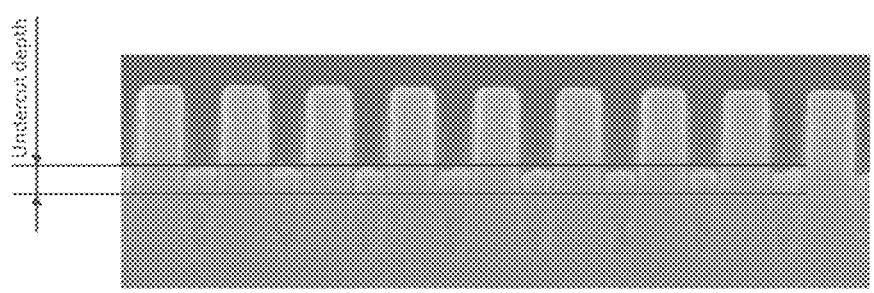
FIG. 4 depicts a dimension corresponding to undercut depth.

"SC-1 resistance testing" of an SOC layer is performed by spin-coating an approximately 180-nm thick coating of the SOC (carbon-rich) composition on top of a TiN liner topography substrate. For a high-temperature SOC (i.e., one that is thermally stable at temperatures of 300° C. or higher), the coating step is followed by baking at about 170° C. for about 1 minute on a hotplate and at about 450° C. for about 4 minutes in a furnace in an $N_2$ atmosphere. For a low-temperature SOC (i.e., one that is not thermally stable at temperatures of 300° C. or higher), the coating step is followed by baking at about 205° C. for about 1 minute on a hotplate. The layer is then etched back with $O_2$ plasma to partially remove the material to mid-trench depth, and the substrate is immersed in an SC-1 etchant bath at about 60° C. for about 100 seconds. An SEM (300kx) cross-section analysis is performed to determine the undercut depth. FIG. 3 shows the flow for the SC-1 testing, and FIG. 4 shows the method of measuring the undercut depth. The wafer in FIG. 3 was an SC-1 wafer with an ALD layer of TiN with 50-nm line/space and 200-nm deep features. The undercut depth is less than about 50 nm, preferably less than about 40 nm, more preferably less than about 30 nm, even more preferably less than about 20 nm, and most preferably about 0.1 nm (or even about ( ) nm) to about 10 nm. SOC or carbon-rich compositions or layers that perform within these parameters are considered to possess the property of being SC-1 resistant.

"SC-1 resistance testing" of a primer layer is performed by forming an approximately 5-nm thick coating of additive-containing primer layer on a TiN liner topography substrate followed by baking at about 150° C. for about 60 seconds. Next, an approximately 180-nm thick SOC layer (conventional or additive-containing) is formed on the primer layer followed by baking at about 170° C. for about 1 minute on a hotplate and at about 450° C. for about 4 minutes in a furnace in an $N_2$ atmosphere for a high-temperature SOC, or followed by baking at about 205° C. for about 1 minute on a hotplate for a low-temperature SOC. The layer is then etched back with $O_2$ plasma to partially remove the SOC material to mid-trench depth, and the substrate is immersed in an SC-1 etchant bath at about 40° C. to about 60° C. for about 100 seconds. An SEM (300kx) cross-section analysis is performed to determine the undercut depth. The undercut depth is less than about 50 nm, preferably less than about 40 nm, more preferably less than about 30 nm, even more preferably less than about 20 nm, and most preferably about 0.1 nm (or even about 0 nm) to about 10 nm. Primer layers that perform within these parameters are considered to possess the property of being SC-1 resistant. The same test is suitable for testing collective SC-1 resistance of a primer layer and SOC when both the primer layer and SOC include SC-1 resistant additives.

Additional advantages of the various embodiments will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present disclosure encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone: B alone: C alone: A and B in combination: A and C in combination; B and C in combination; or A, B, and C in combination. The present description also uses numerical ranges to quantify certain parameters relating to various embodiments. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the disclosure. It is to be understood, however, that

Example 1

Epoxy Cresol Novolac Reaction with 3,4,5-Triacetoxybenzoic Acid in PGME

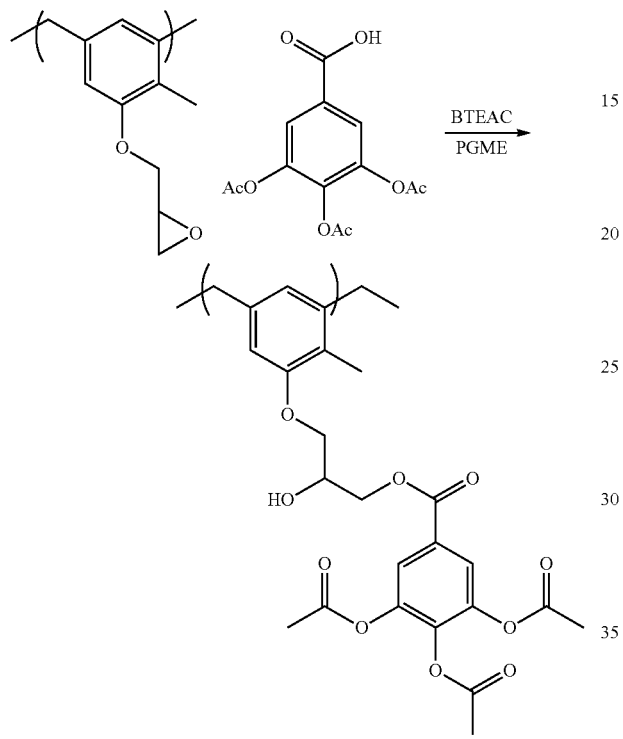

In this Example, 3.01 grams of epoxy cresol novolac (YDCN-500-90P, Kukdo Chemical Co., LTD.), 5.00 grams of 3,4,5-triacetoxybenzoic acid (TABA, Neostar United [Changzhou] Industrial Co., Ltd.), and 0.21 gram benzyltriethylammonium chloride (BTEAC) were added to a 100-ml round-bottom flask. These solids were dissolved in 32.88 grams of PGME (Fujifilm Ultra Pure Solutions, Inc., Carrollton, TX) that was added to the round-bottom flask. The flask was equipped with a condenser in the center neck and a nitrogen inlet at the top of the condenser. The reaction was stirred magnetically under nitrogen while the oil bath was heated to 110° C. over a period of 30 minutes. The reaction was held at 110° C. under nitrogen with magnetic stirring for 18 hours.

Example 2

Coating Formulation with Example 1 Polymer

In this Example, 9.7 grams of OptiStack® SOC110E material (a commercially available spin on carbon (carbon-rich) material, Brewer Science, Inc., Rolla, MO, US) with a 65:35 PGME:PGMEA solvent ratio was combined with 0.29 gram of a 20% solids solution of the polymer synthesized in Example 1. The solution was mixed thoroughly and filtered through 0.1-μm PTFE membrane filter.

Example 3

Coating Formulation with Example 1 Polymer and TAG

In this Example, 9.4 grams of OptiStack® SOC110E material with a 60:40 PGME:PGMEA solvent ratio was combined with 0.53 gram of a 20% solids solution of the material synthesized in Example 1. Next, 0.1 gram of a 5% TAG2689 (King Industries, Norwalk, CT) was added to the polymer mixture. The solution was mixed thoroughly and filtered through 0.1-μm PTFE membrane filter.

Example 4

SC-1 Resistance of Formulations from Examples 2 and 3

The formulations from Example 2 and 3 were individually spin coated at 1,500 rpm for 60 seconds on TiN liner-coated chips containing narrow trenches (50-nm lines, 50-nm spaces, and 200-nm deep trenches in each instance). The chips were baked at 205° C. for 1 minute on a hotplate, followed by plasma etching to remove the coating in the open area and to partially remove the coating in the trenches, resulting in thicknesses of about 100 nm inside the trenches (about half the trench depth). Next, the chips were immersed in SC-1 etchant (1:1:5 ammonium hydroxide:hydrogen peroxide:DI water) at 60° C. for 100 seconds. After being air dried, the chips were examined by SEM. The results showed that there was significantly less undercut on the chips coated with formulations from Examples 2 and 3 than those from the control sample of OptiStack® SOC110E material. These results are shown in FIGS. 5A and 5B.

Example 5

Styrene-r-glycidyl Methacrylate Copolymer (P(S-r-GMA))

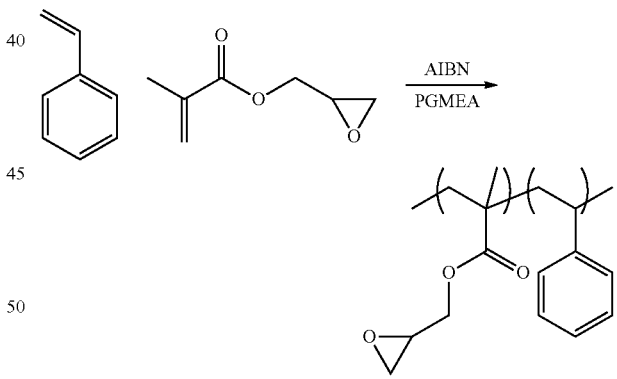

A copolymer was prepared by adding 4.17 grams of styrene (Univar Solutions, Downers Grove, IL), 5.67 grams of glycidyl methacrylate (Monomer Polymer and Dajac Labs, Ambler, PA), 0.197 gram azobisisobutyronitrile (AIBN, Charkit Chemical Company, Norwalk, CT), and 29.56 grams PGMEA (Fujifilm Ultra Pure Solutions, Inc., Carrollton, TX) to a round bottom flask and purged with $N_2$ for 10 minutes before being placed in an oil bath at 75° C. for 24 hours. The resulting viscous solution was cooled to room temperature and diluted with acetone before being precipitated into ~400 mL of hexanes (Tedia Company, Fairfield OH). The hexanes were decanted, and the polymer dried under vacuum at 40° C. overnight.

Example 6

TABA-Functionalized P(S-r-GMA)

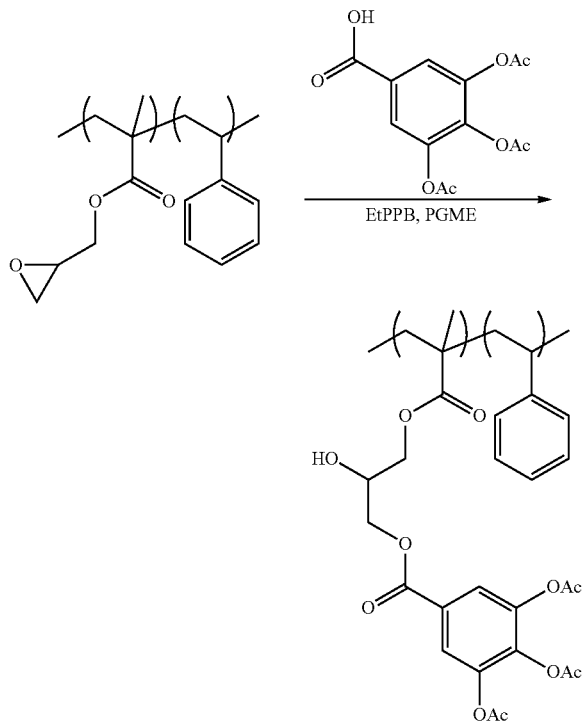

The polymer prepared in Example 5 was functionalized by adding 3.69 grams of P(S-r-GMA), 4.44 grams of TABA, 0.22 gram of ethyltriphenylphosphonium bromide (EtPPB, Sigma Aldrich, St. Louis, MO), and 33.44 grams of PGME to a round bottom flask and stirred under $N_2$ at 70° C. for 24 hours. The resulting solution was collected and used without further purification.

Example 7

Esterification of TABA with 2-Hydroxyethyl Methacrylate

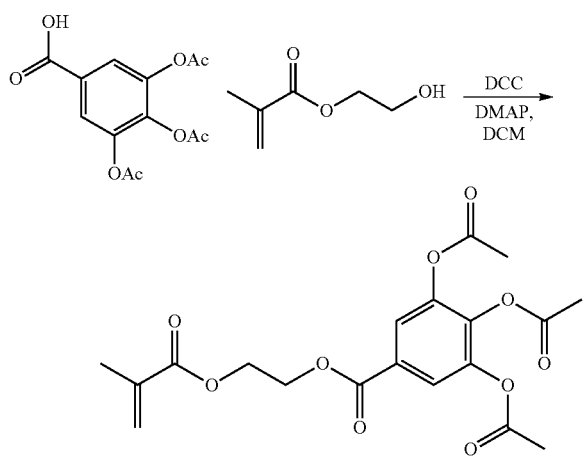

In this Example, 6.51 grams of 2-hydroxyethyl methacrylate (TCI Chemical Industries, Portland, OR), 10.32 grams of N,N-dicyclohexylcarbodiimide (DCC, TCI Chemical Industries, Portland, OR), 0.31 gram of 4-dimethylaminopyridine (DMAP, TCI Chemical Industries, Portland, OR), and 100 milliliters of dichloromethane (DCM, TCI Chemical Industries, Portland, OR) were added to a round bottom flask and stirred in an ice bath under $N_2$. Next, 14.81 grams of TABA were added in three portions, and the resulting suspension was stirred for 24 hours. The precipitate was filtered off, and the filtrate washed with 0.1 M HCl and DI water before being dried over $MgSO_4$. The salt was filtered by gravity, and the dichloromethane removed by rotary evaporation. The resulting solid was dried under vacuum at 40° C. overnight.

Example 8

Polymerization of Styrene and TABA-Functionalized Hydroxyethyl Methacrylate

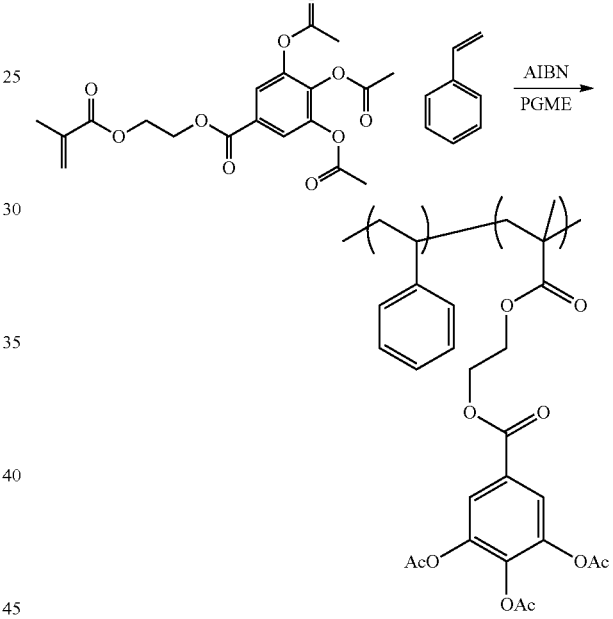

In this Example, 1.3 grams of styrene, 5.10 grams of 5-((2-(methacryloyloxy) ethoxy) carbonyl)benzene-1,2,3-triyl triacetate (prepared in Example 7), 0.062 gram of AIBN, and 19.22 grams of PGME were added to a round bottom flask and purged with $N_2$ for 10 minutes. The reaction was then stirred at 75° C. for 24 hours before being cooled to room temperature. The resulting viscous solution was collected and used as mother liquor.

Example 9

Coating Formulation with Polymer of Example 6

A coating formulation was prepared using the TABA-Functionalized P(S-r-GMA) polymer prepared in Example 6. Specifically, 9.7 grams of OptiStack® SOC110E material with an 82:18 PGME:PGMEA solvent ratio was combined with 0.32 gram of a 20% solids solution of the Example 6 polymer. Next, 0.01 gram of a 5% TAG2689 solution and 0.03 gram of a 0.5% Capstone™ FS3100 solution (The Chemours Company FC, LLC. Newark, DE) were added to the polymer mixture. The solution was mixed thoroughly and filtered through a 0.1-μm PTFE membrane filter.

Example 10

Coating Formulation with Polymer of Example 8

A coating formulation was prepared using the styrene and TABA-functionalized HEMA copolymer of Example 1. In this procedure, 9.75 grams of OptiStack® SOC110E material with an 82:18 PGME:PGMEA solvent ratio was combined with 0.26 gram of a 25% solids solution of the polymer synthesized in Example 8. Next, 0.01 gram of a 5% TAG2689 solution and 0.03 gram of a 0.5% Capstone™ FS3100 solution were added to the polymer mixture. The solution was mixed thoroughly and filtered through a 0.1-μm PTFE membrane filter.

Example 11

Diimide Synthesis and Purification

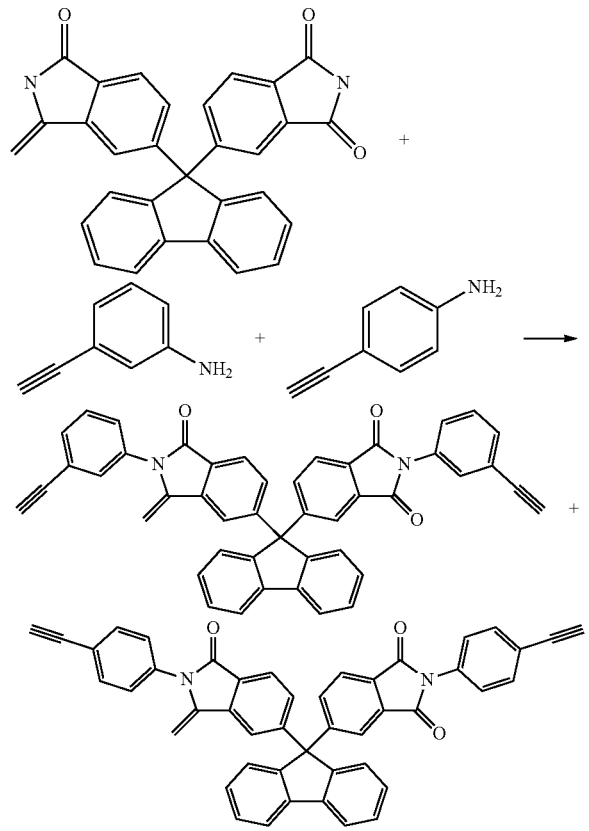

In this Example, 27.18 grams of 9,9-bis(3,4-dicarboxyphenyl) fluorene dianhydride (FDAH, JFE, Japan) were added to a 500-ml round-bottom flask. Next, 13.94 grams of 3-ethynylaniline (3-EA, TCI America, Portland, OR) were dissolved in 163.56 grams of PGMEA (General Chemical Corporation, USA), and the solution was added to an addition funnel, which was connected to the round-bottom flask. The system was purged with nitrogen for 10 minutes, after which the 3-EA solution was added dropwise to the flask and stirred magnetically under nitrogen over a period of 4 minutes. The reaction was allowed to proceed at room temperature under nitrogen with magnetic stirring for 4 hours, after which the flask was connected to a condenser, and the reaction temperature was raised to 150° C. The imidization reaction was allowed to proceed at 150° C. under nitrogen with magnetic stirring for 8 hours.

The diimide solution was precipitated in hexanes (1:5 weight ratio, Sigma Aldrich, St Louis, MO). The precipitated diimide was filtered and washed with hexanes (Tedia High Purity Solvents, Fairfield, OH) and then dried in a vacuum oven at 70° C. overnight.

Example 12

Coating Formulation with Diimide of Example 11 and Polymer of Example 1

In this Example, 2.87 grams of the diimide prepared in Example 11 were combined with 0.29 grams of a 20% solids solution of the polymer synthesized in Example 1. Next, 0.06 grams of NeoFARIT 7177C-30A solution (a polyphenol in 30% solids solution, Mitsubishi Gas Chemical America, New York, NY) and 0.06 grams of a 1% R30N solution (MEGAFACE R-30-N, DIC International, Parsippany, NJ) were added to the polymer mixture. The sample was diluted with 0.24 grams of PGME and 6.49 grams of PGMEA. The solution was filtered through a 0.1-μm PTFE membrane filter.

Example 13

Coating Formulation with Diimide of Example 11 and Polymer of Example 1

In this Example, 3.06 grams of the diimide obtained in Example 11 was combined with 0.09 grams of a 20% solids solution of the polymer synthesized in Example 1. Next, 0.06 grams of NeoFARIT 7177C-30A solution (30% solids solution) and 0.06 grams of a 1% R30N solution were added to the polymer mixture. The sample was diluted with 0.39 grams of PGME and 6.33 grams of PGMEA. The solution was filtered through a 0.1-μm PTFE membrane filter.

Example 14

SC-1 Resistance Test of Formulations of Examples 12 and 13

The coating formulations prepared in Examples 12 and 13 were spin coated at 1,500 rpm for 60 seconds on TiN liner-coated chips containing narrow trenches (50-nm lines, 50-nm spaces, and 200-nm deep trenches in each instance). The chips were baked at 170° C. for 1 minute on a hotplate followed by a 4 minute bake at 450° C. in a furnace with $N_2$ atmosphere followed by plasma etching to remove the coating in the open area and to partially remove the coating in the trenches, resulting in thicknesses of about 100 nm inside the trenches (about half the trench depth). Next, the chips were immersed in SC-1 etchant (1:1:5 ammonium hydroxide/hydrogen peroxide/DI water) at 40° C. for 100 seconds. After being air dried, the chips were examined by SEM. The results (see FIGS. 6A and 6B) showed that there was significantly less undercut on the chips coated with solutions from Examples 12 and 13 than those from the control sample of the same base material without the additive of the material synthesized in Example 1.

Example 15

SC-1 Resistance Test of Example 1 Material with SOC

A primer layer of the polymer solution from Example 1 was formed by spin coating that polymer solution at 1,500 rpm for 60 seconds on TiN liner-coated chips containing narrow trenches (50)-nm lines, 50)-nm spaces, and 200-nm deep trenches in each instance). The chips were baked at 150° C. for 60 seconds on a hotplate. The chips were then stripped with PGME by puddling solvent on the chips for 30 seconds followed by spin drying at 2,000 rpm for 30 seconds, resulting in primer layer thicknesses of about 5 Å, based on spectral evidence. Next, OptiStack® SOC110E material (Brewer Science, Inc., Rolla, MO) was spin coated over the primer layer at 1,500 rpm for 60 seconds, and the chips were baked at 205° C. for 60 seconds on a hotplate. After baking, the chips were plasma etched to remove the coating in the open areas and to partially remove the coating in the trenches, resulting in SOC layer thicknesses of about 100 nm inside the trenches (about half the trench depth). The chips were then immersed in SC-1 etchant (1:1:5 ammonium hydroxide/hydrogen peroxide/DI water) at 60° C. for 100 seconds. After air drying, the chips were examined by SEM.

Figure 7:
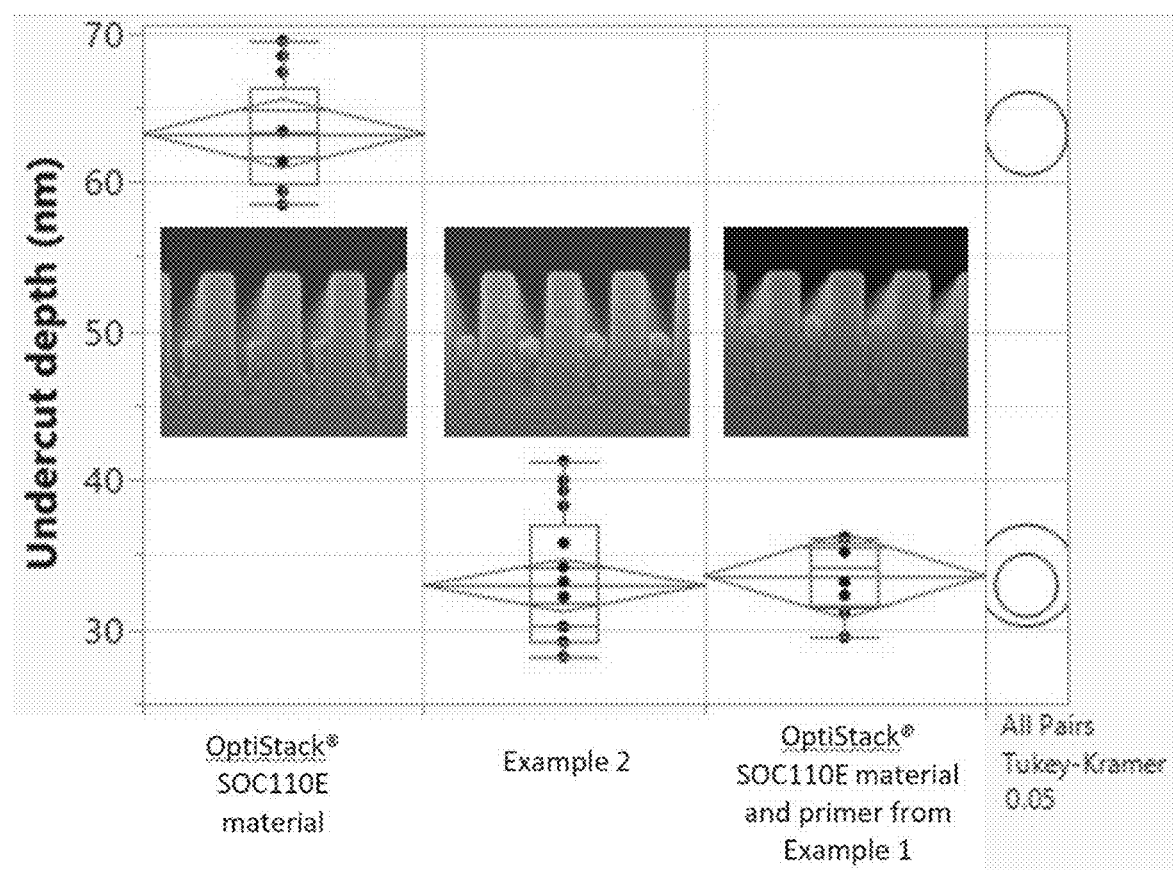
FIG. 7 shows SEM images of cross-sections of TiN chips and graphs comparing the respective undercuts of, left to right: a commercially available SOC layer without additive or primer layer: the Example 2 formulation (additive in the same commercially available SOC layer); and the Example 1 formulation as a primer layer under the same commercially available SOC layer, all after SC-1 resistance testing (see Example 15)

FIG. 7 shows a comparison between blending and primer methods on SC-1 resistance of the OptiStack® SOC110E material. The level of SC-1 resistance improvement using the TABA-functionalized polymer as a primer layer was equivalent to using the Example 2 formulation, in which a TABA-functionalized polymer was used as an additive.

Example 16

SC-1 Resistance Test of Example 1 Material with Antireflective Coating

A primer layer of the polymer solution from Example 1 was formed by spin coating that polymer solution at 1,500 rpm for 60 seconds on TiN liner-coated chips containing narrow trenches (50)-nm lines, 50-nm spaces, and 200-nm deep trenches in each instance). The chips were baked at 150° C. for 60 seconds on a hotplate. The chips were then stripped with PGME by puddling solvent on the chip for 30 seconds and spin dried at 2,000 rpm for 30 seconds, resulting in primer layer thicknesses of about 5 Å, based on spectral evidence. A commercial bottom antireflective coating, DUV 252 material (Brewer Science, Inc., Rolla, MO), was then spin coated over the primer material at 1,500 rpm for 60 seconds, and the chips were baked at 205° C. for 60 seconds on a hotplate, resulting in antireflective coating thicknesses of about 180 nm. The chips were then plasma etched to remove the coating in the open area and to partially remove the coating in the trenches, followed by immersion in SC-1 etchant (1:1:5 ammonium hydroxide/hydrogen peroxide/DI water) at 60° C. for 100 seconds. After being air dried, the chips were examined by SEM.

Figure 8:
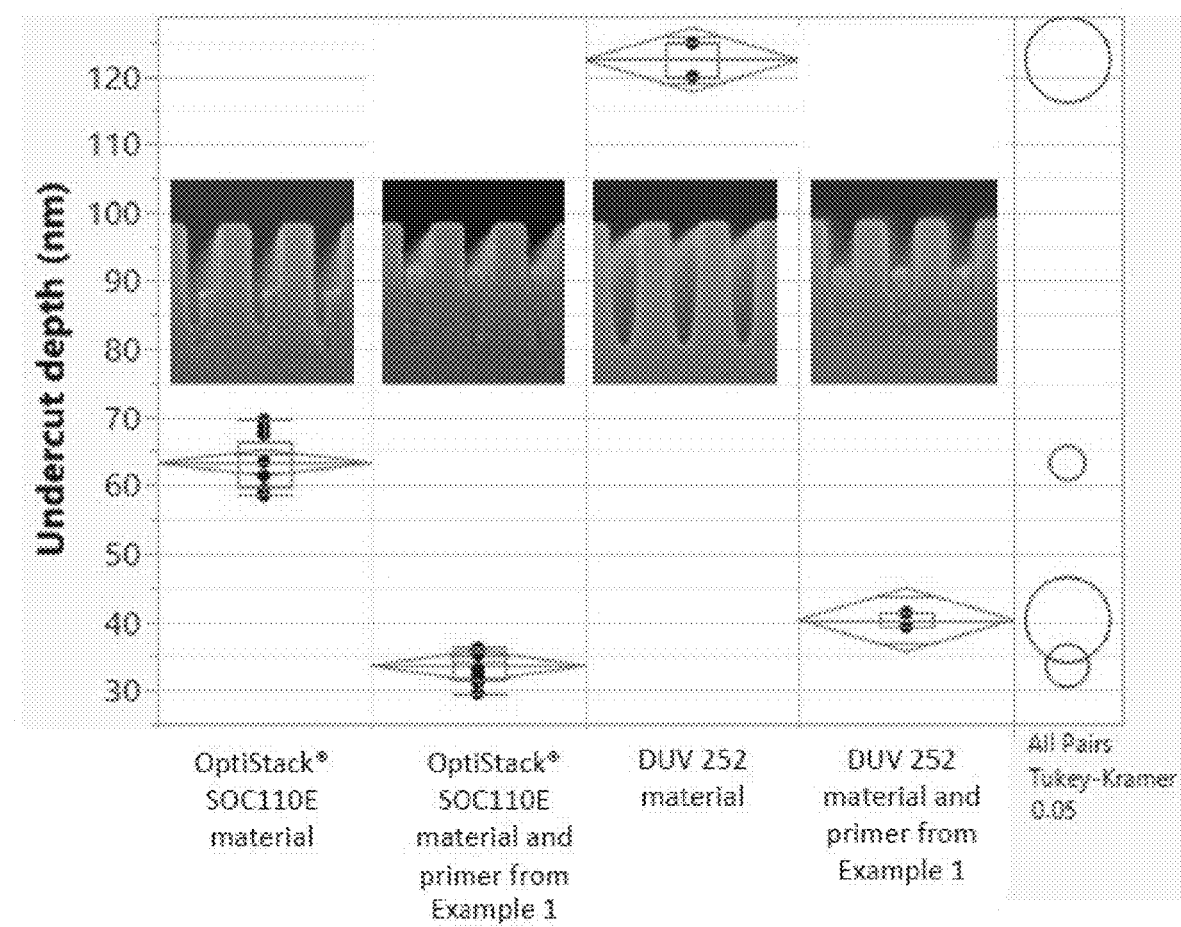
FIG. 8 shows SEM images of cross-sections of TiN chips and graphs comparing the respective undercuts of, left to right: a commercially available SOC layer without additive or primer layer: the Example 1 formulation as a primer layer under the same commercially available SOC layer; a commercially available antireflective layer without additive or primer layer; and the Example 1 formulation as a primer layer under the same commercially available antireflective layer, all after SC-1 resistance testing (see Example 16).

FIG. 8 shows that the primer layer greatly improved the SC-1 resistance of the DUV 252 material. DUV 252 material coated without the primer layer was completely removed during SC-1 immersion, while the primed substrate coated with DUV 252 material withstood the test, resulting in TiN undercut comparable to the same process with OptiStack® SOC110E material shown in Example 15.

The invention claimed is:

1. A method of forming a microelectronic structure, said method comprising:
optionally forming one or more intermediate layers on a substrate surface, there being an uppermost intermediate layer on said substrate surface, if one or more intermediate layers are present;
applying a composition to said uppermost intermediate layer, if present, or to said substrate surface, if no intermediate layers are present, said composition comprising a compound comprising a 3,4,5-triacetoxybenzoic acid moiety; and
heating said composition to form a carbon-rich layer.

2. The method of claim 1, further comprising:
optionally forming one or more additional intermediate layers on said carbon-rich layer, there being an uppermost additional intermediate layer on said carbon-rich layer, if one or more additional intermediate layers are present;
applying an imaging layer to said uppermost additional intermediate layer, if one or more additional intermediate layers are present, or to said carbon-rich layer, if no additional intermediate layers are present;
patterning said imaging layer to form a pattern therein;
transferring said pattern to said one or more additional intermediate layers on said carbon-rich layer, if present, and to said carbon-rich layer; and
contacting said carbon-rich layer with SC-1.

3. The method of claim 1, wherein said compound is chosen from one or both of:
a polymer functionalized with said 3,4,5-triacetoxybenzoic acid moiety; or
an oligomer functionalized with said 3,4,5-triacetoxybenzoic acid moiety.

4. The method of claim 3, wherein one or both of said polymer or oligomer comprise monomers chosen from phenolic compounds, styrene, styrene-containing compounds, glycidyl-containing compounds, 2-hydroxyethyl methacrylate, hydroxypropyl methacrylate, hydroxybutylacrylate, or combinations thereof.

5. The method of claim 1, wherein said compound is chosen from an epoxy cresol novolac functionalized with said 3,4,5-triacetoxybenzoic acid moiety, an epoxy phenol novolac functionalized with said 3,4,5-triacetoxybenzoic acid moiety, or both.

6. The method of claim 1, wherein said composition further comprises:
a polymer different from said compound;
an oligomer different from said compound; or
both a polymer and an oligomer different from said compound.

7. The method of claim 6, wherein at least one of the following is true:
said polymer different from said compound is chosen from polystyrene, functionalized polystyrene derivatives, polysulfones, polyethersulfones, poly(ether ether ketone), polycarbonates, epoxies, novolacs, polyimides, or combinations thereof; or
said oligomer different from said compound comprises a diimide.

8. The method of claim 1, wherein said carbon-rich layer has the property of being SC-1 resistant.

9. The method of claim 1, wherein said substrate surface comprises at least one intermediate layer, and said uppermost intermediate layer comprises a TiN layer or an $SiO_2$ layer.

10. A method of forming a microelectronic structure, said method comprising:
optionally forming one or more intermediate layers on a substrate surface, there being an uppermost intermediate layer on said substrate surface, if one or more intermediate layers are present;
forming a primer layer on said uppermost intermediate layer, if present, or on said substrate surface, if no intermediate layers are present, said primer layer being formed from a composition comprising a compound comprising a 3,4,5-triacetoxybenzoic acid moiety; and
forming a carbon-rich layer on said primer layer.

11. The method of claim 10, further comprising:
optionally forming one or more additional intermediate layers on said carbon-rich layer, there being an uppermost additional intermediate layer on said carbon-rich layer, if one or more additional intermediate layers are present;
applying an imaging layer to said uppermost additional intermediate layer, if one or more additional intermediate layers are present, or to said carbon-rich layer, if no additional intermediate layers are present;
patterning said imaging layer to form a pattern therein;
transferring said pattern to said one or more intermediate layers on said carbon-rich layer, if present, and to said carbon-rich layer; and
contacting said carbon-rich layer with SC-1.

12. The method of claim 10, wherein said compound is chosen from one or both of:
a polymer functionalized with said 3,4,5-triacetoxybenzoic acid moiety; or
an oligomer functionalized with said 3,4,5-triacetoxybenzoic acid moiety.

13. The method of claim 12, wherein one or both of said polymer or oligomer comprises monomers chosen from phenolic compounds, styrene, styrene-containing compounds, glycidyl-containing compounds, 2-hydroxyethyl methacrylate, hydroxypropyl methacrylate, hydroxybutylacrylate, or combinations thereof.

14. The method of claim 10, wherein said compound is chosen from an epoxy cresol novolac functionalized with said 3,4,5-triacetoxybenzoic acid moiety, an epoxy phenol novolac functionalized with said 3,4,5-triacetoxybenzoic acid moiety, or both.

15. The method of claim 10, wherein said primer layer has the property of being SC-1 resistant.

16. The method of claim 10, wherein said substrate surface comprises at least one intermediate layer, and said uppermost intermediate layer comprises a TiN layer or an $SiO_2$ layer.

* * * * *